(12) United States Patent
Prestros

(10) Patent No.: US 7,405,688 B2
(45) Date of Patent: Jul. 29, 2008

(54) ANALOGUE-TO-DIGITAL CONVERTER AND METHOD FOR CONVERTING AN ANALOGUE INPUT SIGNAL INTO A DIGITAL INFORMATION

(75) Inventor: Ralph Prestros, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/595,783

(22) Filed: Nov. 10, 2006

(65) Prior Publication Data

US 2008/0106450 A1    May 8, 2008

(30) Foreign Application Priority Data

Nov. 3, 2006    (DE) .................. 10 2006 051 981

(51) Int. Cl.
*H03M 1/12* (2006.01)
(52) U.S. Cl. .................. 341/155; 341/158; 341/159; 341/164; 341/169
(58) Field of Classification Search .................. 341/164
See application file for complete search history.

(56) References Cited

U.S. PATENT DOCUMENTS

| | | | | |
|---|---|---|---|---|
| 4,243,974 A | * | 1/1981 | Mack | .................. 341/139 |
| 5,103,171 A | | 4/1992 | Petersen | |
| 5,676,867 A | * | 10/1997 | Van Allen | .................. 219/130.1 |
| 6,014,768 A | * | 1/2000 | Lee et al. | .................. 714/795 |
| 6,147,486 A | | 11/2000 | Koss et al. | |
| 6,404,372 B1 | | 6/2002 | Heithoff | |
| 6,492,929 B1 | * | 12/2002 | Coffey et al. | .................. 341/155 |
| 6,686,861 B1 | * | 2/2004 | Kobayashi et al. | .................. 341/155 |
| 6,717,393 B2 | * | 4/2004 | Male | .................. 324/76.17 |
| 7,095,354 B2 | * | 8/2006 | Harrison et al. | .................. 341/159 |

FOREIGN PATENT DOCUMENTS

| | | |
|---|---|---|
| DE | 39 26 617 A1 | 2/1991 |
| DE | 197 32 960 A1 | 2/1999 |
| DE | 102 58 762 A1 | 7/2004 |

* cited by examiner

*Primary Examiner*—Khai M Nguyen
(74) *Attorney, Agent, or Firm*—Maginot, Moore & Beck

(57) ABSTRACT

An analogue-to-digital converter comprises a window comparator. The window comparator comprises an input for an analogue input signal and an output for a comparison result indicating a result of a comparison of the analogue input signal with an upper bound and a lower bound of a level window. The analogue-to-digital converter further comprises a level window position signal generator. The level window position signal generator comprises an output for a level window position signal adjusting a position of the level window based on an information derived from the comparison result and indicating whether the level window should be increased, decreased or maintained. The analogue-to-digital converter further comprises an output for a digital information based on the comparison result.

20 Claims, 6 Drawing Sheets

ANALOGUE-TO-DIGITAL CONVERTER AND METHOD FOR CONVERTING AN ANALOGUE INPUT SIGNAL INTO A DIGITAL INFORMATION

BACKGROUND OF THE INVENTION

The present invention is generally related to an analogue-to-digital converter and a method for converting an analogue input signal into a digital information.

In the recent years, digital signal processing has been used in more and more applications. However, many environmental signals are primarily available as analogue quantities. Also, the transmission of information over different types of links often requires treating signals as analogue signals. Consequently, there is a big need for the conversion of an analogue into a digital signal.

Many concepts have been proposed, each of the concepts addressing particular requirements with respect to speed, power consumption, accuracy and costs. However, there is still a demand for improved analogue-to-digital conversion solutions.

BRIEF SUMMARY OF THE INVENTION

The present invention creates an analogue-to-digital converter comprising a window comparator, a level window position signal generator and an output for a digital information. The window comparator comprises an input for an analogue input signal and an output for a comparison result indicating a result of a comparison of the analogue input signal with an upper bound and a lower bound of a level window. The level window position signal generator comprises an output for a level window position signal adjusting a position of the level window based on an information derived from the comparison result and indicating whether the level window should be increased, decreased or maintained. The output provides a digital information based on the comparison result.

BRIEF DESCRIPTION OF THE DRAWINGS

Preferred embodiments of the present invention will subsequently be described taking reference to the enclosed figures, in which.

DETAILED DESCRIPTION OF THE INVENTION

Figure 1:
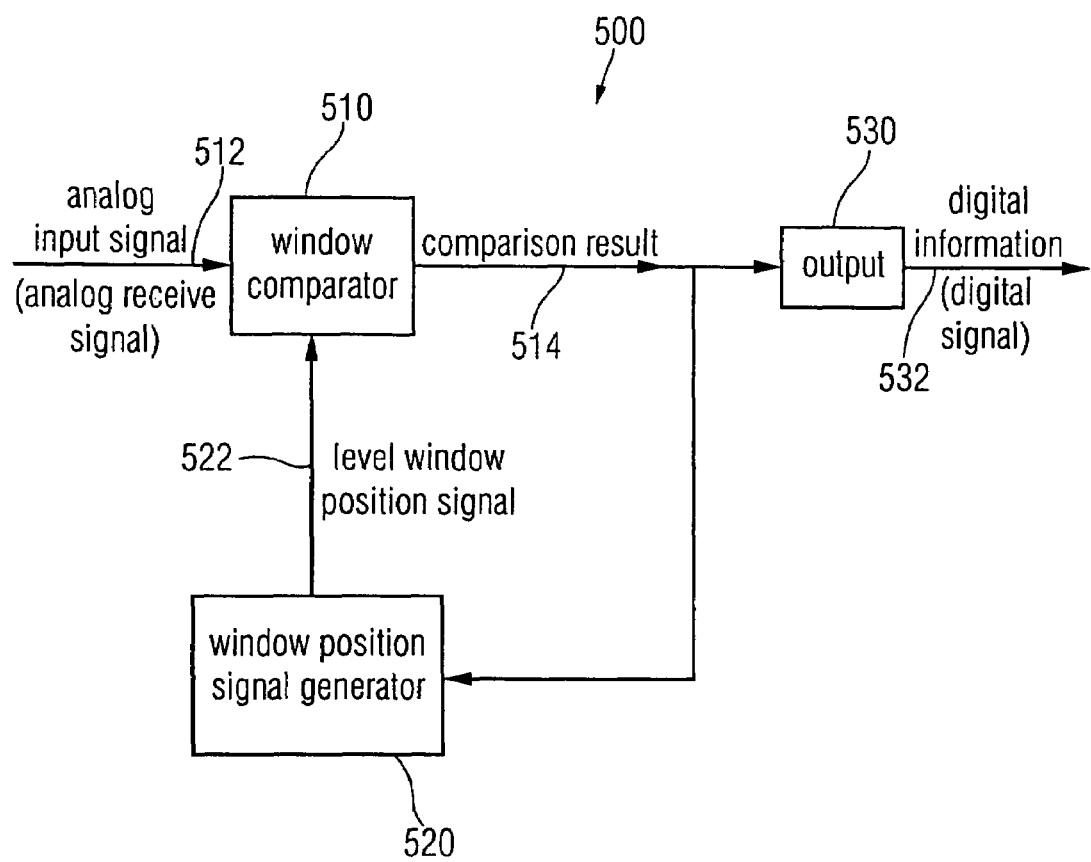
FIG. 1 shows a block schematic diagram of an analogue-to-digital converter according to an embodiment of the present invention.

FIG. 1 shows a block schematic diagram of an analogue-to-digital converter, according to an embodiment of the present invention. The analogue-to-digital converter of FIG. 1 is designated in its entirety with 500. The analogue-to-digital converter 500 comprises a window comparator 510. The window comparator comprises an input 512 for an analogue signal and an output for a comparison result 514 indicating a result of a comparison of the analogue input Signal 512 with an upper bound and a lower bound of a level window. The analogue-to-digital converter 500 further comprises a level window position signal generator 520. The level window position signal generator 520 comprises an output for a level window position signal 522 adjusting a position of a level window based on the comparison result 514. The analogue-to-digital converter further comprises an output 530 for a digital information 532 based on the comparison result 514.

In the following, the functionality of the inventive analogue-to-digital converter 500 will be described. It should be noted here that the window comparator 510 uses a level window having an upper bound and a lower bound. Thus, the window comparator 510 receives the analogue input signal 512 and provides the comparison result 514, such that the comparison result 514 indicates whether the analogue input signal 512 is above the upper bound of the level window, within the level window (i.e. between the upper bound of the level window and the lower bound of the lower window), or below the lower bound of the level window. Thus, the comparison result 514 preferably describes three possibilities.

Accordingly, the level window position signal generator 520 is adapted to adjust the position of the level window in dependence on the three possible states of the comparison result 514. Consequently, the use of the window comparator 514 provides for a flexible way of taking into consideration a relation between a level of the analogue input signal 512 and bounds of the level window. Consequently, a special handling can be introduced when the level of the analogue input signal 512 is within the level window, (i.e. between the lower bound of the level window and the upper bound of the upper window), as defined by the level window position signal 522. Thus, making use of the window comparator 510, a hard transition between a first state in which the level of the analogue signal 512 is below a reference level and a second state in which the level of the analogue input signal 512 is above the reference level is avoided. Rather, a state between the lower bound of the level window and the upper bound of the level window is introduced as an intermediate state, resulting in a three-state comparison result 514.

Thus, the analogue-to-digital converter as explained with reference to FIG. 1 represents an analogue-to-digital converter, where a level window position is adjusted in dependence an a comparison result, the comparison result describing a comparison between bounds of the level window and the analogue window signal 514, wherein three states of the comparison result 514 are handled.

Making use of three states, in particular of a state in which the level of the analogue input signal 512 is within the level window, brings along the possibility to reduce the number of switching operations when compared to a conventional analogue-to-digital converter. This is due to the fact that in the preferred embodiment, the state, during which the analogue input signal 512 is within the level window, may be maintained for an extended interval in time, as noise contained within the analogue input signal 512 is typically too small to move the analogue input signal 512 out of the level window. Thus, according to a preferred embodiment of the present invention, an approximately constant input signal 512 (which may comprise a limited amount of noise or overshoot or undershoot) results in a constant comparison result 514 of the window comparator 510, and consequently in an (at least (approximately) constant level window position signal 522. Thus, according to an embodiment, the present invention brings along the possibility of having a level window position signal 522 following a level of the analogue input signal 512, wherein a permanent change of the level window position signal 522 is avoided, provided analogue signal 512 is approximately constant and remains within the level window.

Figure 2:
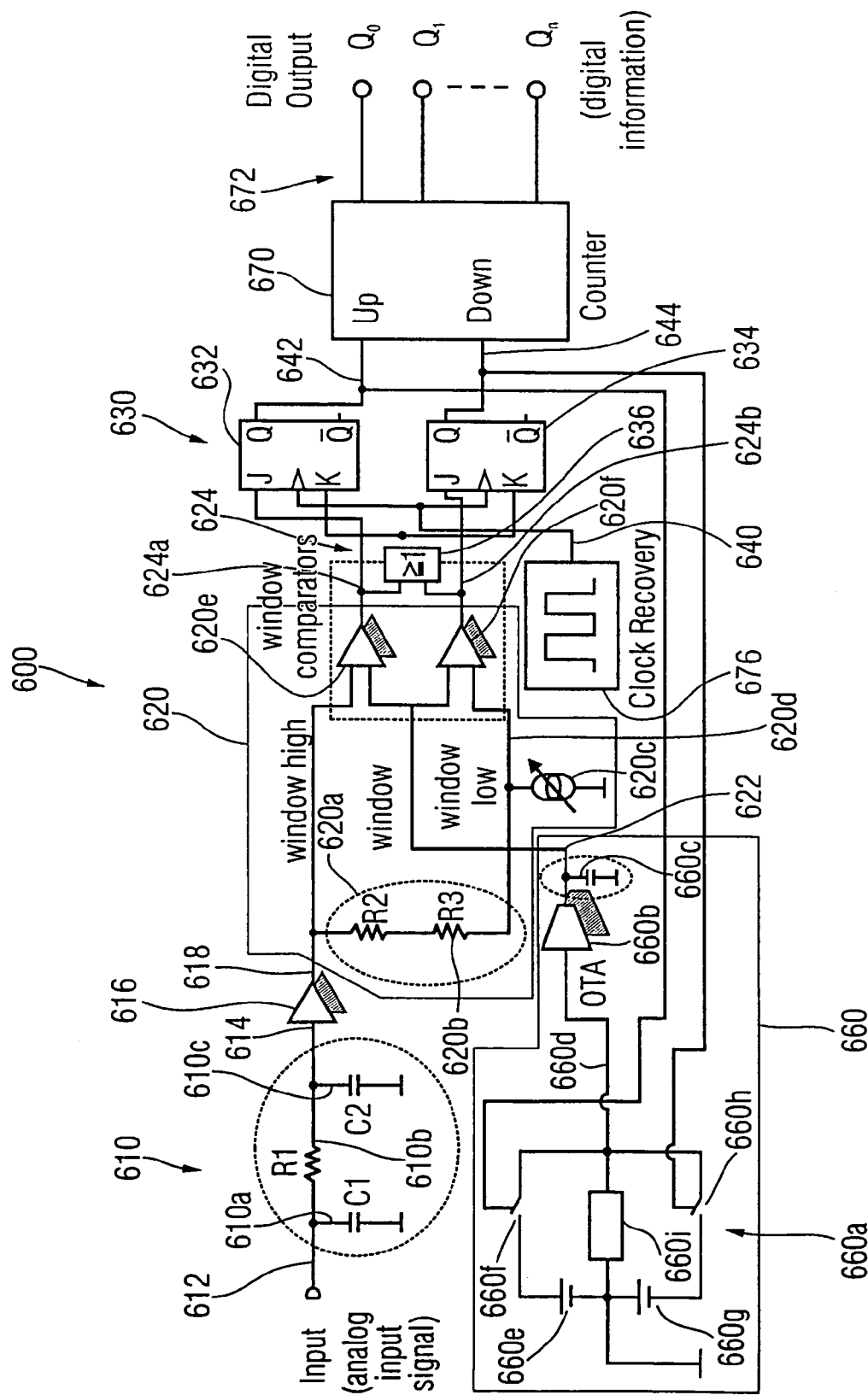
FIG. 2 shows a detailed schematic diagram of an analogue-to-digital converter, according to an embodiment of the present invention.

Further details with respect to an embodiment of the present invention will subsequently be described. For this purpose, FIG. 2 shows a detailed schematic of an inventive analogue-to-digital converter, according to an embodiment of the present invention. The analogue-to-digital converter of FIG. 2 is designated in its entirety with 600.

The analogue-to-digital converter 600 comprises an optional low pass filter 610, which may serve as an anti-aliasing-filter. The low pass filter 610 comprises an input for an analogue input signal 612. The low pass filter 610 further comprises an output for a filtered analogue input signal 614.

The analogue-to-digital converter 600 further comprises and optional amplifier 616 for receiving the filtered analogue input signal 614, and for providing an amplified filtered analogue input signal 618.

The analogue-to-digital converter 600 further comprises a window comparator 620. The window comparator 620 comprises an input for receiving the amplified filtered analogue input signal 618. However, in an alternative embodiment, the window comparator 620 may also be adapted to receive the filtered analogue input signal 614 (e.g. in the case that the optional amplifier 616 is omitted), or to receive the analogue input signal 612 (e.g. in the case that the optional low pass filter 610 is omitted).

The window comparator 620 further comprises an input for a level window position signal 622 for adjusting a position of the level window of the window comparator 620. A generation of the level window position signal 622 will subsequently be described in more detail. The window comparator 620 further comprises an output for a comparison result 624. In an embodiment of the present invention, the comparison result 624 may for example, be provided in the form of two binary signals 624a, 624b. However, any other representation of the comparison result 624 may be chosen, provided that the comparison result 624 indicates whether the level of the input signal of the window comparator 620 is above an upper bound of the level window of the window comparator 620, within the level window of the comparator, (i.e. between a lower bound of the level window and an upper bound of the level window), or below the lower bound of the level window. In other words, the comparison result 624 is a signal having at least three states, as described above.

The analogue-to-digital converter 600 further comprises a control logic 630, which in the embodiment of FIG. 2 comprises a first J-K-flip-flop 632, a second J-K flip-flop 634 and a NOR gate 636. The control logic 630 has a first input for receiving the first comparison result signal 624a and a second input for receiving the second comparison result signal 624b. Moreover, the control logic 630 has a clock input for a clock signal 640. Thus, it should be noted that the control logic 630 is a clocked circuit. The control logic 630 further comprises a first output for providing a count-up signal 642 and a second output for providing a count-down signal 644. It should be noted that the count-up signal 642 and the count-down signal 644 may be considered to constitute a count-up/count-down information.

The analogue-to-digital converter 600 further comprises a level window position generator 660. The level window position signal generator 660 comprises an input for receiving the count-up/count-down information (e.g. the count-up signal 642 and the count-down Signal 644) and an output for providing the level window position signal 622. The output for providing the level window position signal 622 is coupled with a corresponding input of the window comparator 620.

Overall, the level window position signal generator 660 comprises a circuit for providing the level window position signal 622 in dependence on the count-up/count-down information. In other words, the level window position signal generator 660 is adapted to adjust the level window position signal 622 such that the position of the level window follows the level of the input signal of the window comparator 620 (e.g. the signal 618). Thus, the level window position signal generator is adapted to change the level window position signal 622 in response to an activation of the count-up signal 642 into a first direction. Moreover, the level window position signal generator 660 is adapted to change the level window position 622, into a second direction (different from the first direction) in response to the activation of the count-down signal 644.

In a preferred embodiment, the level window position signal generator 660 is adapted to change the level window position signal 622 such that the level window position signal 622 indicates an increased level position of the level window, when the count-up/count-down information indicates that the input signal 618 of the window comparator 620 has a level above the upper bound of the level window. In contrast, the level window position generator 660 is adapted to change the level window position signal 622, such that the level window position signal indicates a decreased level position of the level window, when the count-up/count-down information indicates that a level of the input signal 618 of the window comparator 620 is below a lower bound of the level window.

Moreover, in a preferred embodiment the level window position signal generator 660 is adapted to leave the level window position signal 622 unchanged, if the count-up/count-down information indicates that the level of the input signal 618 of the window comparator 620 is within the level window (i.e. between the lower bound of the level window and the upper bound of the level window). In this case, the level window position signal generator preferably stores the previous level window position signal 622.

In a preferred embodiment, the analogue-to-digital converter 600 further comprises a counter 670. The counter 670 comprises an input for a count-up/count-down information (e.g. for the count-up signal 642 and the count-down signal 644), and further comprises a clock input (not shown). The counter 670 also comprises an output for a count value 672 which is preferably provided in a digital, encoded form, for example in a binary coding. Thus, the count value 672 preferably constitutes the digital information.

It should be noted here, that the counter 670, may for example be adapted to count upwards in response to an edge of the clock signal (not shown), if the count-up signal 642 is active. Moreover, the counter 670 may be adapted to count downwards upon the occurrence of an edge of the clock signal, if the count-down signal 644 is active. Moreover, the counter 670 may be adapted to leave its count value 672 unchanged, if both the count-up signal 642 and the count-down signal 644 are inactive, thus indicating that the input signal 618 of the window comparator 620 is between the lower bound of the level window and the upper bound of the level window.

Overall, it should be noted that the counter 670 is preferably adapted, such that the count value 672 output by the counter 670, follows the position of the level window.

Thus, in a preferred embodiment, the counter 670 is adapted to count in a first direction (e.g. upwards) whenever the level window position signal generator 660 changes the level window position signal 622 in a first level window position change direction (e.g. towards a higher level). Besides, the counter 660 is preferably adapted to count in a second direction (e.g. downwards), whenever the level window position signal generator 660 changing the level of the level window position signal 622 in a second level window position change direction (e.g. towards a lower level). Also, the counter 670 is preferably adapted to leave the count value 672 unchanged, whenever the level window position signal generator 660 leaves the level of the level window position signal 622 unchanged.

Moreover, it should be noted that in a preferred embodiment the counter 670 receives a clock of a same frequency which is used for evaluating the comparison results 624 provided by the window comparator.

The analogue-to-digital converter may (optionally) have an input to receive the clock signal 640. Alternatively, the analogue-to-digital converter 600 may comprise an internal clock source 676. The internal clock source 676 may in one embodiment be a clock recovery circuit adapted to recover a clock of data symbols contained in the input signal 612, or a multiple of the clock of the data symbols. Alternatively, the clock may be extracted from the carrier signal (or from the frequency of the carrier signal), as the bit rate may be dependent on the carrier frequency, or may be in a predetermined relationship with the carrier frequency. Thus, the frequency of the clock signal 640 may be synchronized with a data clock of data symbols in the input signal 612.

Consequently, the clock signal 640 determines a sampling of the comparison result 624, such that the count-up/count-down information is updated in synchronism with the clock signal 640. Besides, the change of the level window position signal 620 is preferably in synchronism with the clock signal 640, as will be described in more details in the following.

Subsequently, details of the blocks of the analogue-to-digital converter 600 will be described.

Firstly, it should be noted that the low pass filter 610 comprises a n-filter, comprising a first capacitor 610a, a resistor 610b and a second capacitor 610c, connected as shown in FIG. 2.

The window comparator 620 comprises an input for the amplified and filtered analogue input signal 618. Moreover, the window comparator comprises a level shifter for producing a level-shifted version of the input signal 618. The level shifter is, for example, implemented by one or more resistors 620a, 620b, which are connected to the input signals. A predetermined current is forced through the resistor 620a and/or resistor 620b making use of a current source 620c. Thus, a level shifted version 620b of the input signal 618 is produced. Moreover, the window comparator 620 comprises a first comparator 620e and a second comparator 620f. The first comparator 620e is adapted to receive the input signal 618 of the window comparator 620 and the level window position signal 622. Moreover, the first comparator 620e is adapted to provide the first comparison result signal 624a (preferably a digital signal) in dependence on whether a level of the input signal 618 of the window comparator 620 is below or above the level of the level window position signal 622. Consequently, the first comparison result signal 624a indicates whether the input signal 618 of the window comparator 620 is below or above a first bound of the level window.

Moreover, the second comparator 640 is adapted to receive as a first input signal, the level shifted version 620d of the input signal 618, and to receive as a second input signal the level window position signal 622. Thus, the second comparator 620f is adapted to produce the second comparison result signal 620d in dependence on whether the level of the level shifted version 620d of the input signal 618 is above or below the level of the level window position signal 622.

In a preferred embodiment of the present invention, the window comparator 620 is adapted to provide a digital signal of logic value "1" at the output of the first comparator 622 and a digital signal of logical value "0", at the output of the second comparator 620f, if the level of the input signal 618 is above the upper bound of the level window. Moreover, if the level of the input signal 618 is within the level window, i.e. if the level of the input signal 618 is above a lower bound of the level window and below an upper bound of the level window, both the first comparison result signal 624a and the second comparison result signal 624b comprise the logical value "0". Besides, if the level of the input signal 618 is below the lower bound of the level window, the first comparison result signal 624a takes the logical value "0" and the second comparison result signal 624 takes the logical value "1".

In the following, the operation of the logic comprising the NOR gate 636 and the J-K-flop-flop 632, 634 will be described. Following the above definition of the logical values of the first comparison result signal 624a and the second comparison result signal 624b, the K-inputs of the J-K flip-flops 632, 634 are active, and the J-inputs of the J-K-flip-flops 632, 634 are inactive when the level of the input signal 618 is within the level window. Consequently, the J-K flip-flops 632, 634 are reset upon an edge of the clock signal 640 under this condition. Thus, if the level of the input signal 618 is within the level window, both the count-up signal 624 and the count-down signal 644 are inactive (comprise a value of logical "0"). As a consequence, when the level of input signal 618 is within the level window, the counter 670 will neither count up nor count down, as soon as the respective information is forwarded to the count-up signal 642 and the count-down signal 644 via the J-K flip-flops 632, 634. Assuming now that the level of the input signal 618 is above the upper bound of the level window, and assuming also that the first comparison result signal 624a is active (logical "1") and the second comparison result signal 624 is inactive (logical "0"), the P-inputs of the J-K-flip-flops 632, 634 are inactive. Moreover, the J-input of the first J-K flip-flop 632 is active and the J-input of the second J-K flip-flop 634 is inactive. Thus, the count-up signal 642 is activated and the count-down signal 644 remains inactive when the level of the input signal 618 is above the upper bound of the level window, as soon as the clock signals 640 is activated. The opposite situation occurs when the level of the input signal 618 is below the lower bound of the level window. In this case, the count-up signal 642 remains inactive, while the count-down signal 644 is activated.

It should be noted here, that it is assumed that there is no immediate transition between a condition in which the level of the input signal 618 is below the level window and a situation in which the level of the input signal 618 is above the level window. In other words, it is assumed that there is always a sequence of the form "level of the input signal 618 below the lower bound of the level window; level of the input signal 618 within the level window; level of the input signal 618 above the level of the level window" or vice-versa.

To summarize the above, there are three possible states of the count-up signals 642 and the count-down signal 644: count-up signal 642 inactive and count-down signal 644 inactive; count-up signal 642 active and count-down signal 644 inactive; count-up signal 642 inactive and count-down signal 644 active.

In a preferred embodiment, a state in which both the count-up signal 642 and the count-down signal 644 are active does not occur. Thus, whenever the counter 670 receives a clock signal (e.g. the clock signal 640), the counter 670 receives a count-up/count-down information (e.g. provided by the count-up signal 642 and the count-down signal 644), instructing the counter to count up, to count down or to leave unchanged the count signal.

In the following, structural details of the level window position signal generator 660 will be discussed. The level window position signal generator 660 comprises a switched voltage source 660*a*, an operational transimpedance amplifier 660*b* and a capacitance 660*c*. It will be recognized that switched voltage source 660*a*, an operational transimpedance amplifier 660*b* and a capacitance 660*c* form an analog integrator. The switched voltage source 660*a* receives the count-up/count-down information and adjusts an input signal 660*d* of the operational transimpedance amplifier 660*b* to one out of, for example, three possible voltage levels in dependence of the count-up/count-down information. For this purpose, the switched voltage source 660*a* comprises, for example, a switch network for connecting the signal 660*d* either to a first voltage source 660*a* (e.g. via a first switch 660*f*), to a second voltage source 660*g* (e.g., via a second switch 660*h*) or to a reference potential (e.g. via a resistor 660*i*). In a preferred embodiment, the first switch 660*f* is closed when the count-up signal 642 is active, thus pulling the signal 660*d* to a first voltage level. If the count-down signal 644 is active, the second switch 660*h* is closed, thus pulling the signal 660*d* to a second voltage level. If both the count-up signal 642 and the count-down signal 644 are inactive, a resistor 660*i* pulls the signal 660*d* to a third voltage level.

The operational transimpedance amplifier 600*b*, the input of which is connected to the signal 600*d*, and the output of which is connected to one terminal of the capacitance 600*c*, is adapted to provide a current for charging the capacitance 600*c*, when the first voltage level is present at its input, and to provide a current for discharging the capacitance 600*c*, when the second voltage level is present at its input. Moreover, the operational transimpedance amplifier 600*b* is adapted to provide a current for leaving the charge of the capacitance 600*c* unchanged, when the third voltage level is present at its input. For example, the operational transimpedance amplifier 660*b* is adapted to provide zero current, if the signal 600*d* provided to its input takes the third voltage level. Alternatively, the operational transimpedance amplifier 660*b* may be adapted to provide a current balancing leakage currents of the capacitance 660*c*, when the voltage at its input takes the third voltage level.

Thus, the voltage of the capacitance 660*c* is increased, kept constant or decreased independence on the count-up/count-down information. It should be noted that the voltage of the capacitance 660*c* is used to provide the level window position signal 622. In one simplified embodiment, the voltage of the capacitance 660*c* is directly used as the level window position signal 622. However, circuitry (e.g. amplifiers, buffers, level shifters, and the like) may be present in order to derive the level window position signal from the voltage of the capacitance 660*c*.

Taking reference to the embodiment of FIG. 2, it should be noted that in a preferred embodiment the state of the switches 660*f*, 660*h* remains constant for one period of the clock signal 640, as the count-up signal 642 and the count-down signal 644 are updated only in response to the edge of the clock signal 640. Thus, in the embodiment of FIG. 2, the voltage of the capacitance 660*c* changes in a fashion approximately linear with time, during a full period of the clock signal 640. However, in another practical embodiment, the logic circuitry 630 and/or the level window position window generator 660 can be adapted such that the voltage of the capacitance 660*c* changes only for a period of the time which is shorter than the period of the clock signal 640. For example, it may be preferred that the time over which the voltage of the capacitance 660*c* changes in response of the edge of the clock signal 640 is not longer than half a period of the clock signal 640. In another embodiment, it is preferred that the period of time during which the voltage of the capacitance 660*c* changes is no longer than 10% of the period time of the clock signal 640. In another preferred embodiment, the time during which the voltage of the capacitance 660*c* changes is identical to half a period of the clock signal 640, as such a timing can be implemented in a particularly simple way.

Summarizing the above, it can be noted that the analogue input signal 622 is increased by a predetermined amount or decreased by a predetermined amount in response to the count-up/count-down information. Alternatively, it can be stated that the level of the level window position signal 622 is increased or decreased in response to the comparison result, which is for example, represented by the first comparison result signal 624*a* and the second comparison result signal 624*b*.

It should be noted that the control circuitry 630, as provided by the NOR date 636, the first J-K flip-flop 632, and the second J-K flip-flop 634, may be changed according to the specific requirements of the application. Moreover, the mechanism for the generation of the level window position signal 622 on the basis of the comparison result may be changed, as long as it is ensured that the three possible different comparison results (input signal 618 below, within or above the level window) result in different temporal evolutions of the level window position signal 620 (e.g. increasing, decreasing, or remaining unchanged).

Figure 3:
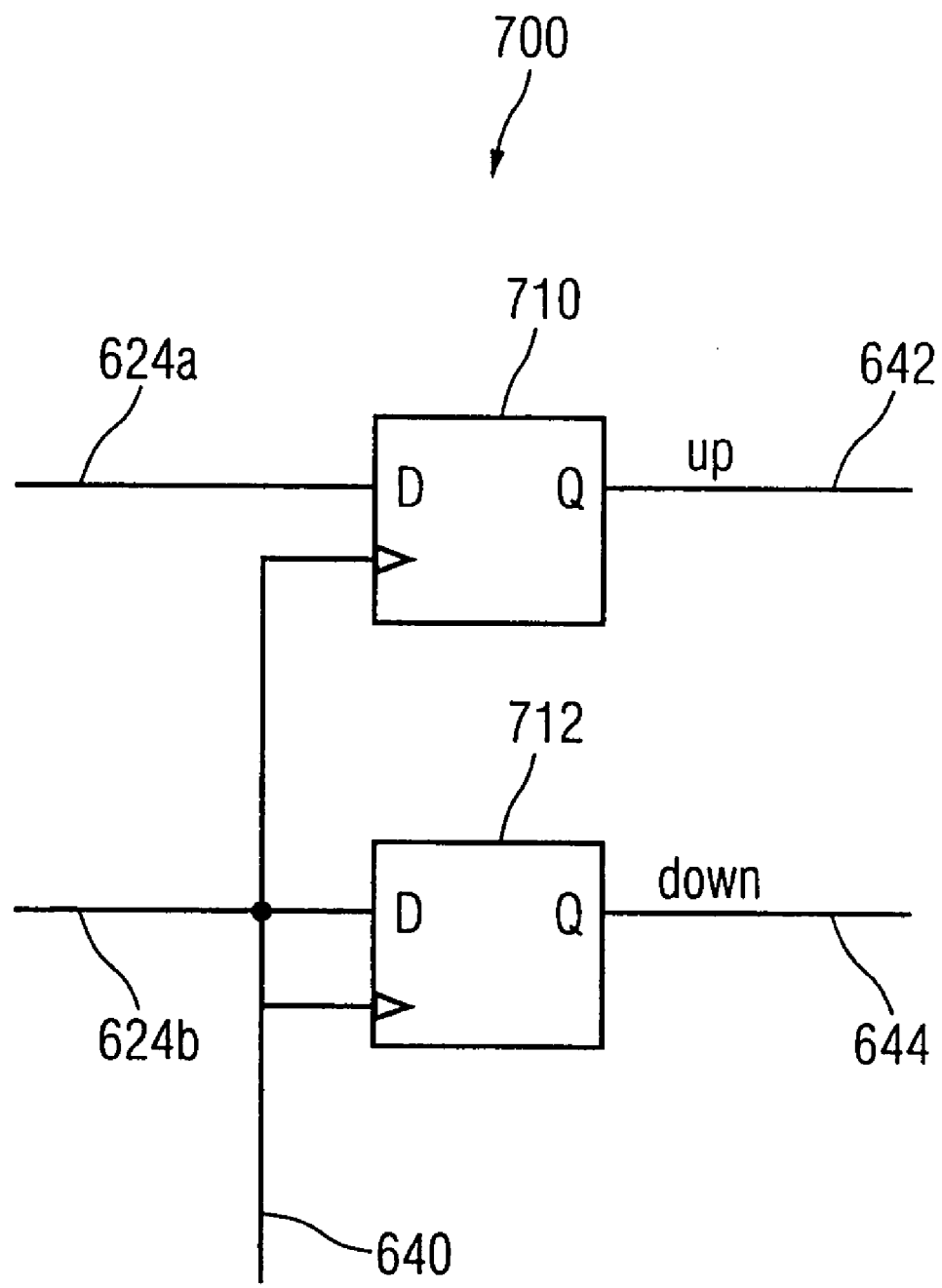
FIG. 3 shows a schematic representation of a data latch, which can be used in an embodiment of the analogue-to-digital converter.

In the following, an alternative implementation of a circuit for deriving the count-up signal 642 and the count-down signal 644 on the basis of the first comparison result signal 624*a* and the second comparison result second comparison result 624*b* will be described taking reference to FIG. 3. The circuit shown in the schematic diagram of FIG. 3 is designated in its entirety with 700. It should be noted that the circuit 700 may for example replace the NOR gate 636, the first J-K flip-flop 632 and the second J-K flip-flop 634. The circuit 700 comprises a first D-flip-flop 710 and a second D-flop-flop 712. The D-flip-flop 710 receives the first comparison result signal 624*a* as a data input signal. The second D-flip-flop 712 receives the second comparison result second comparison result 624*b* as a data input signal. Moreover, both the first D-flip-flop 710 and the second D-flip-flop 712 receive the clock signal 640 as their respective clock signals. Besides, the first D-flip-flop 710 provides as its output signal (Q) the count-up signal 642. The second D-flip-flop 712 provides as its output signal (Q) the count-down signal 644. In other words, the count-up signal 642 is a latched version of the first comparison result signal 624*a*, and the count-down signal 644 is a latched version of the second comparison result signal 624*b*.

Figure 3A:
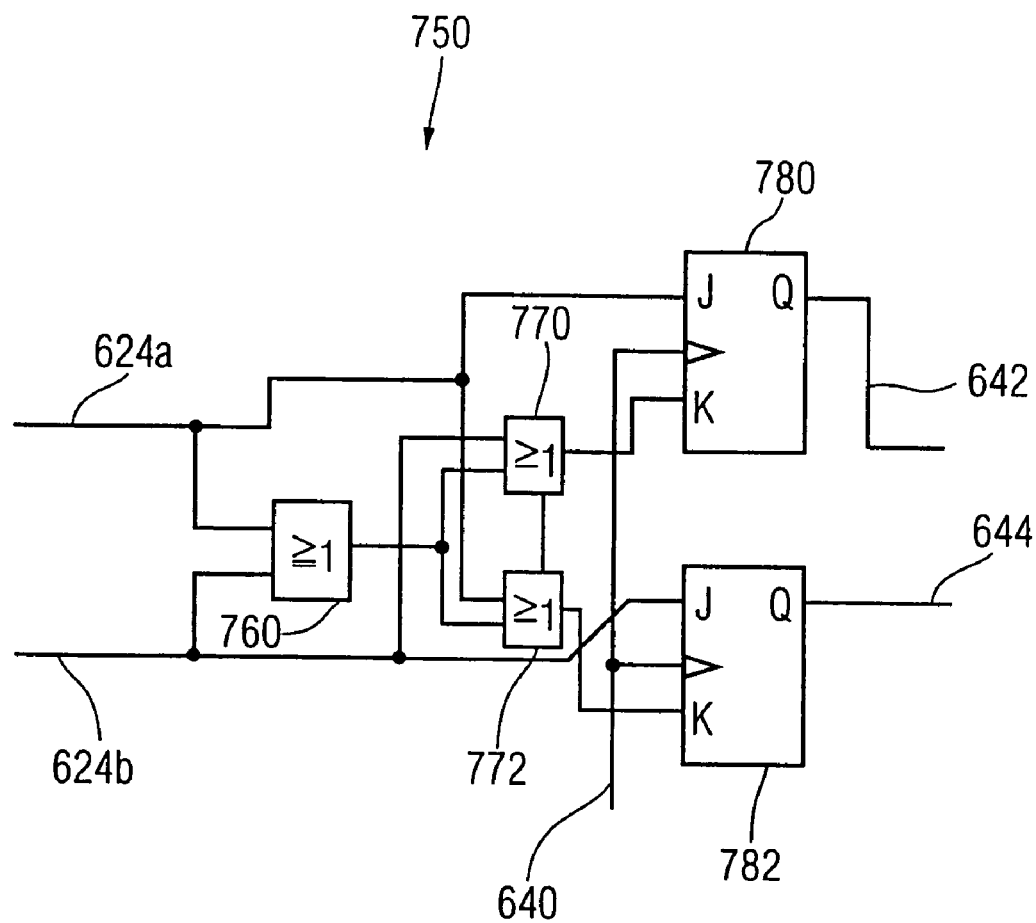
FIG. 3a shows a schematic representation of an alternative data latch which can be used in an embodiment of the analogue-to-digital converter.

In the following, another alternative embodiment of a circuit for deriving the count-up signal 642 and the count-down signal 644 on the basis of the first comparison result signal 624*a* and the second comparison result second comparison result 624*b* will be described taking reference to FIG. 3*a*. FIG. 3*a* shows a schematic diagram of an alternative implementation of the logic circuit 630. The logic circuit of FIG. 3*a* is designated in its entirety with 750. It should be noted here that same means and signals are designated with the same reference numbers in FIGS. 2, 3 and 3*a*.

The circuit 750 receives the first comparison result signal 624a and the second comparison result signal 624b. Moreover, the circuit 750 receives the clock signal 640. The circuit 750 is adapted to provide the count-up signal 642 and the count-down signal 644. The circuit 750 comprises a NOR gate 760. The NOR gate 760 receives at its first input the first comparison result signal 624a and at its second input the second comparison result signal 624b.

Moreover, the circuit 750 comprises a first OR gate 770, which receives at a first input the second comparison result signal 624b and at a second input an output signal of the NOR gate 760. A second OR gate 772 receives at its first input the first comparison result signal 624a and at its second input the output signal of the NOR gate 760.

Circuit 750 further comprises a first J-K-flip flop 780 and a second J-K-flip flop 782. A J-input of the first J-K-flip flop 780 receives the first comparison result signal 624a. A K-input of the first J-K-flip flop 780 receives an output signal of the first OR-gate 770. A J-input of the second J-K-flip flop 782 receives the second comparison result signal 624b. A K-input of the J-K-flip flop 782 receives an output signal of the second OR gate 772. Moreover, clock inputs of the first J-K-flip flop 780 and of the second J-K-flip flop 782 both receive the clock signal 640. It should be noted that the first J-K-flip flop 780 provides the count-up signal 642 at its non-inverting output Q. The second J-K-flip flop 782 provides the count-down signal 644 at its non-inverting output Q.

Figure 4:
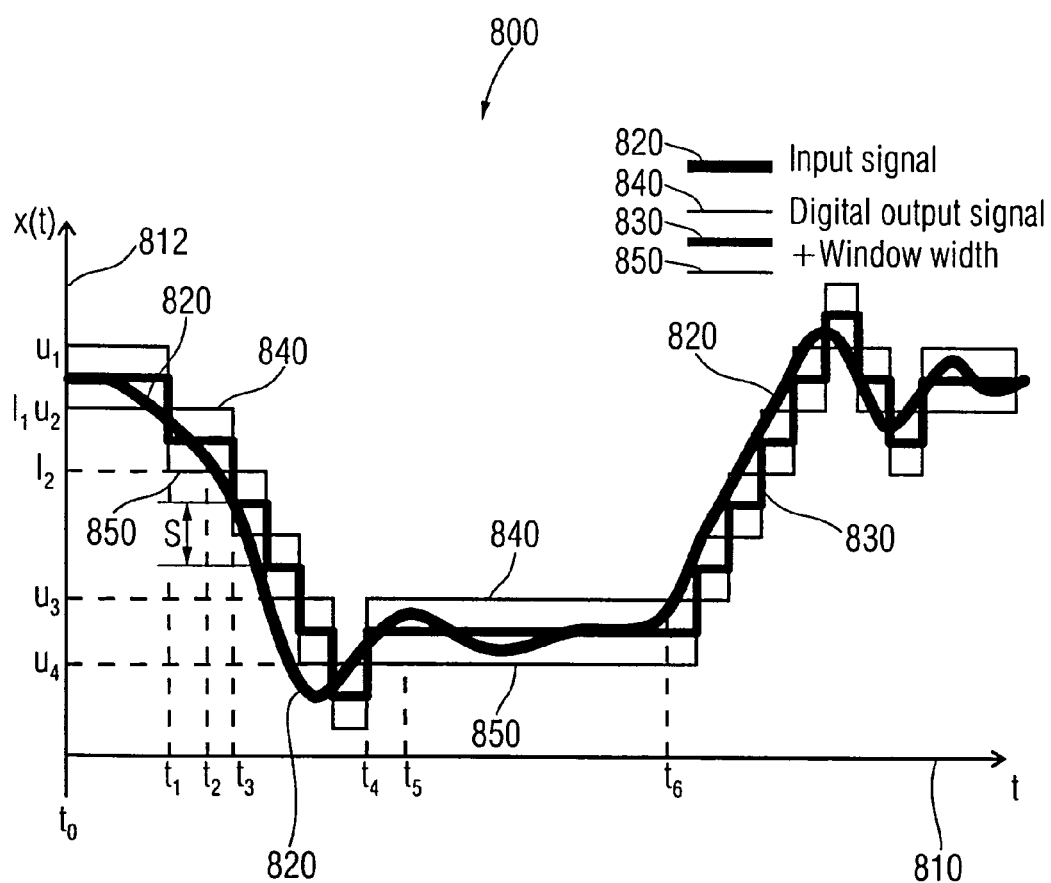
FIG. 4 shows a graphical representation of an input signal and a digital output signal for an analogue-to-digital converter according to an embodiment of the present invention.

In the following, the operation of the circuit 600 of FIG. 2 will be described with reference to FIG. 4. FIG. 4 shows a schematic representation of a time evolution of an input signal, a digital output signal and a window width. The graphical representation of FIG. 4 is designated in its entirety with 800. An abscissa 810 represents a time, and an ordinate 812 represents a level of the input signal, a value of the digital output signal and a level of the level window of the window comparator 620.

The time evolution of the input signal (e.g. of the input signal 612, the filtered input signal 614, the amplified and filtered input signal 618, or the analogue input signal 512) is represented by a first curve 820 (smooth curve). Moreover, a temporal evolution of a digital output signal, e.g. the counter value 672 or the digital information 532, is represented by a second curve 830 (bold black step curve). It should be noted that the digital output signal changes in predetermined steps, a step size being designated with S. Moreover, a third curve 840 (thin curve) shows a temporal evolution of an upper bound of the level window, and a fourth curve 850 (thin curve) shows a temporal evolution of a lower bound of the level window.

It should be noted that the a graphical representation 800 of FIG. 4, a temporal evolution of the digital output signal 830, a temporal evolution of the upper bound 840 of the level window and a temporal evolution 850 of the lower bound of the level window are shown. However, this is indeed a simplified representation. As can be seen from the circuit 600 of FIG. 2, the level of the level window position signal 620 may be a continuously changing analogue value, not comprising any steps. Moreover, as can be seen from the circuit 600 of FIG. 2, the capacitor 666c may explicitly provide limited slope of the level window position signal 622. Moreover, as described above, a level of the level signal 622 may, for example, change in a uniform way (i.e. either increase, decrease or remain unchanged) during a period of the clock signal 640.

However, the control logic 630 and/or the level window position signal generator 660 may be adapted such, that a level of the level window position signal 622 changes only for a part of a period of the clock signal 640, and remains constant for the rest of the period of the clock signal 640.

However, it should be noted that in a preferred embodiment a level of the level window position signal 622 corresponds, at least approximately, to the digital output signal.

In FIG. 4, it can be seen that a relation between the level window and an actual value of the input signal is evaluated at the beginning of a clock period of the clock signal. A temporal position of a first beginning of the clock period is designated with $t_1$. A temporal position of a beginning of a second clock period is designated with $t_2$, and a temporal position of a beginning of a third clock period is designated with $t_3$. A lower bound of the level window at a time $t_1$ is designated with $l_1$, and an upper bound of the level window at a time $t_1$ is designated with $u_1$. It can be seen from FIG. 4 that at time $t_1$, the input signal (represented by curve 820) is below the lower bound $l_1$ of the level window. Consequently, the comparison information or comparison result 514, 624 indicates the status. Thus, the digital information 532 or counter value 672 (represented by the second curve 830) is decreased (for example by one step) at time $t_1$. In parallel, the level window is also decreased. The decrease of the level window may for example occur at time $t_1$, or between time $t_1$ and time $t_2$. In the graphical representation of FIG. 4, a change of the position of the level window at time $t_1$ is shown.

A second evaluation of the comparison information or comparison result occurs at time $t_2$. An upper bound $u_2$ of the level window at a time $t_2$ may be identical to a lower bound $l_1$ of the level window at time $t_1$, but does not need to be. Moreover, the lower bound of the level window at position $t_2$ is designated with $l_2$. As can be seen, at time $t_2$ a level of the input signal (represented by curve 820) lies between the upper bound $u_2$ of the level window a time $t_2$ and the lower bound $l_2$ of the level window at time $t_2$. This situation (or relation) is represented by an according comparison result 514 or comparison information 624. As a consequence, the level window is left unchanged between time $t_2$ and time $t_3$ (wherein time $t_2$ and time $t_3$ may, for example, be defined by subsequent edges of the clock signal 640). It should be noted here that in fact it is not required that the level window is left absolutely unchanged between a time $t_2$ and time $t_3$.

Rather, in one embodiment it is sufficient if the condition holds that the level window is changed by a smaller amount when the comparison information indicates that the input signal lies within the level window than when the comparison result indicates that the level of the input signal lies outside of the level window. In other words, a small change of the level of the level window may occur between the times $t_2$ and $t_3$ (i.e. following time $t_2$) when a level of the input signal lies within the level window.

However, in a preferred embodiment the absolute magnitude of the change of the level of the level window between times $t_2$ and $t_3$ is preferably smaller than an absolute magnitude of the change of the level window between times $t_1$ and $t_2$ (i.e. after a time when the level of the input signal lies outside of the level window).

For the sake of explanation, it should be noted that at time $t_4$ a level of the input signal lies above an upper bound $u_4$ of the level window at a time $t_4$. Thus, the upper bound of the level window is increased to value $u_5$ at time $t_4$, or between times $t_4$ and $t_5$ (i.e. during a period of the clock signal 640 following time $t_4$).

It should also be noted that during a time interval between $t_4$ and $t_5$, the level of the input signal lies within a constant, time-invariant level window, while the actual level of the input signal is varying slightly. However, between time $t_4$ and time $t_6$ the digital output signal remains unchanged, as the level of the input signal never (at least not during edges of the clock signal) exceeds the upper bound 840 of the level window and never falls below the lower bound of the level window. Consequently, both of the bounds of the level window are constant between times $t_4$ and $t_6$ (at least between times $t_5$ and $t_5$, if it is assumed that the position of the level window changes between time $t_4$ and $t_5$).

Thus, no change of the digital output signal occurs between times $t_4$ and $t_6$. This is a big advantage of the present invention when compared to conventional analogue digital converters making use of comparators, as a change of the digital output signal typical requires a large amount of energy. Some types of circuits (e.g. CMOS circuits) comprise a very low power consumption when a previous state is maintained. Thus, the present invention results in a particularly low power consumption of the output 530 or of the counter 670. Moreover, it can be seen that the level window is constant between times $t_4$ and $t_6$ (or at least between times $t_5$ and $t_6$). A change of the level window typically requires energy (e.g. for charging or discharging capacitor 660c). Leaving the level window unchanged is typical a particularly energy efficient state of operation. Consequently, according to one embodiment of the present invention, the inventive analogue-to-digital converter is particularly energy efficient, if the input signal comprises only small changes (cf. the time period between times $t_4$ and $t_6$).

Referring to the overall functionality of the analogue-to-digital converter, it should be noted that both the digital output signal and the level window follow the input signal, as can be seen from FIG. 4. However, it should be noted that the digital output signal in a preferred embodiment follows the analogue input signal at discrete instances of time (e.g. when edges of the clock signal 640 occur). Also, it should be noted that the digital output signal is a quantized representation of the analogue input signal and therefore does not ideally represent the value of the analogue input signal.

Moreover, the rate (or slope) at which the digital output signal follows the input signal is limited, as can, for example, be seen between times $t_3$ and times $t_4$.

Moreover, it should be noted that the bounds of the level window follow the level of the input signal, though not in an ideal way. Rather, in a preferred embodiment the change of the bounds of the level window is initiated at discrete instance of time (namely when an edge of the clock signal 640 occurs). Besides, the timing, according to which the bounds of the level window follow the level of the input signal is determined by the level window position signal generator 660.

It should be noted that there is an overall tendency of the digital output signal and of the bounds of the level window to follow the input signal, though not in an ideal fashion, as outlined above.

The circuits described with reference to FIGS. 1 and 2 act as an analogue-to-digital converter. Consequently disadvantages of a conventional circuit (namely its insensitivity to small modulation amplitudes or its sensitivity to overshoots) are overcome.

However, when using the analogue-to-digital converters 500, 600 of FIGS. 1 and 2, it is preferred to apply a separate digital detection circuit based on a modern digital signal processing algorithm.

Making use of the analogue-to-digital converter 500 or 600 (possibly in combination with the digital detection circuit based on a modern digital signal processing algorithm) the following advantages can be obtained:

a) a separation of a demodulation and a detection allows the use of a digital signal processing algorithm, which allows for the application of a sophisticated digital detection algorithm (e.g. a Viterbi-algorithm).

b) the window comparator can be used for overshoot suppression.

c) the window comparator reduces the number of switching operations, and consequently reduces the current consumption.

d) the circuits 500, 600 of FIGS. 1 and 2 can be easily realised using a low-cost CMOS process.

Thus, it can generally be stated that the key idea of the present invention is to construct an adoption of a sigma-delta analogue-to-digital converter.

Moreover, it should be noted that the above-described demodulation circuit (comprising, for example, the analogue-to-digital converter 500 of FIG. 1, or the analogue-to-digital converter 600 of FIG. 2, and, optionally, an additional digital signal processing means) could fully replace a conventional 10%-demodulator, which is sensitive to overshoots and undershoots.

It should be noted that making use of the inventive analogue-to-digital converters 500, 600, problems can be overcome which result from using only one analogue circuit for demodulation and detection.

It should be noted that a key problem of using only one analogue circuit for demodulation detection is the fact that signal redundancy is often lost for a sophisticated detection algorithm. Making use of the inventive analogue-to-digital converters 500, 600 only for demodulation, and performing detection using a modern digital processing algorithm (e.g. the Viterbi algorithm) significant improvements when compared to conventional set-ups can be achieved.

Figure 5:
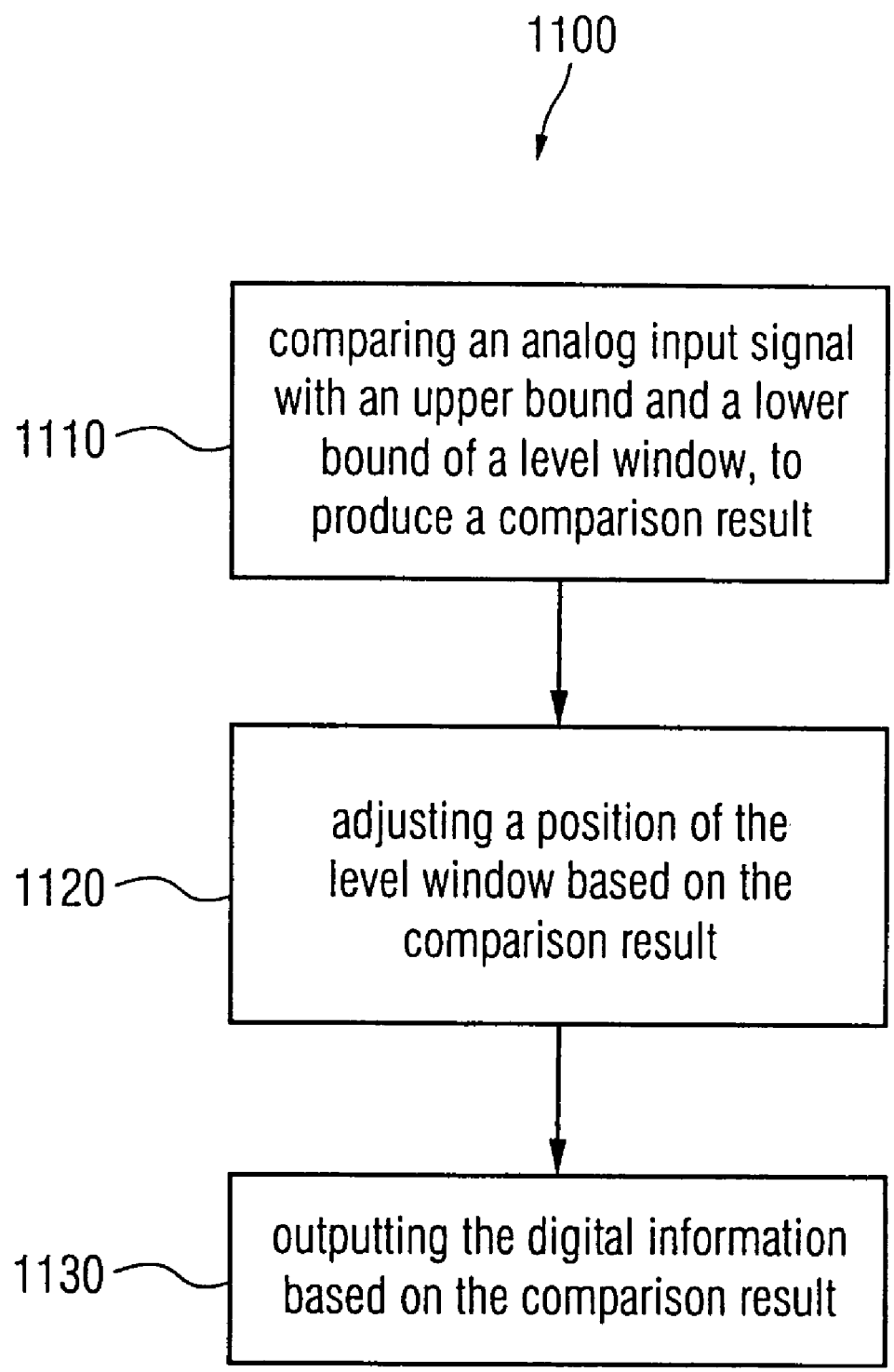
FIG. 5 shows a flowchart of a method for converting an analogue input signal into a digital information.

FIG. 5 shows a flowchart of a method for converting an analogue input signal into a digital information. The method is designated in its entirety with 1100.

The method 1100 comprises a step 1110 of comparing an analogue input signal with an upper bound of a level window and a lower bound of a level window, to produce a comparison result. The method 1100 also comprises a step 1120 of adjusting a position of the level window based on the comparison result. Moreover, the method 1100 comprises a step 1130 of outputting the digital information based on the comparison result.

Moreover, the method 1100 can optionally be supplemented by any steps performed by the above described apparatus.

To summarize the above, the present invention creates an analogue-to-digital converter having a particularly low power consumption while allowing for a simple implementation.

The invention claimed is:

1. An analog-to-digital converter, comprising:
   a window-comparator comprising an input for an analog input signal and an output for a comparison result indicating a result of a comparison of the analog input signal with an upper bound and a lower bound of a level window;
   a level window position signal generator, the level window position signal generator comprising a window position control input coupled, directly or via a control logic, to the output for the comparison result, and an output for a level window position signal adjusting a position of the level window based on information derived from the comparison result and indicating whether the level window should be increased, decreased or maintained, wherein the level window position signal generator comprises an analog integrator, the analog integrator comprising a controlled current source and a capacitor, wherein the controlled current source is configured to provide a current for charging the capacitor, for discharging the capacitor or for leaving the charge of the capacitor unchanged, in dependence on the comparison result, wherein the voltage of the capacitor is used to provide the level window position signal, wherein the level window position signal increases the position of the level window, if the comparison result indicates that the level of the input signal is above the upper bound of the level window, wherein the level window position signal decreases the position of the level window, if the comparison result indicated that the level of the input signal is below the lower bound of the level window, and wherein the level window position signal leaves the position of the level window unchanged, if the comparison result indicates that the level of the input signal is between the lower bound of the level window and the upper bound of the level window;

an output for digital information based on the comparison result; and a counter, the counter comprising a count-up/count-down control input coupled, directly or via a control logic, to the output for the comparison result, and a counter state interface for the digital information.

2. The analog-to-digital converter of claim 1, wherein the digital information increases, decreases or remains constant in dependence on the comparison result.

3. The analog-to-digital converter of claim 2, wherein the digital information remains constant when the comparison result indicates that a level of the analog input signal lies between the lower bound and the upper bound.

4. The analog-to-digital converter of claim 2, wherein the digital information changes in coordination with the position of the level window.

5. The analog-to-digital converter of claim 1, wherein the level window position follows the input signal.

6. The analog-to-digital converter of claim 1, wherein the analog-to-digital converter comprises clocked control logic, the clocked control logic comprising an input for a clock signal, an output for a level window position control signal for the level window position signal generator, the clock signal determining sampling times when the comparison result is processed to update the level window position control signal.

7. The analog-to-digital converter of claim 1, wherein the analog integrator comprises an integration input and an integration output, wherein the integration input is coupled, directly or via a control circuit, to the output for the comparison result, and wherein the integration output is coupled, directly or via an intermediate circuitry, to the output for the level window position signal.

8. The analog-to-digital converter of claim 1, wherein the level window position signal generator comprises a switched voltage source, the switched voltage source comprising a switch control input coupled to the output for the comparison result, and a voltage signal output;

wherein the level window position signal generator comprises a transimpedance amplifier, the transimpedance amplifier comprising a voltage input coupled to the voltage signal output and a current output coupled to a capacitor.

9. An analog-to-digital converter, comprising:

means for comparing an analog input signal with an upper bound and a lower bound of a level window to produce a comparison result;

means for adjusting a position of the level window based on information derived from the comparison result and indicating, whether the level window should be increased, decreased or maintained; and means for outputting digital information based on the comparison result, wherein the means for adjusting the position of the level window comprises means for storing a charge, and means for providing a current for charging the means for storing a charge, for discharging the means for storing a charge or for leaving the charge of the means for storing a charge unchanged, in dependence on the comparison result;

wherein the voltage of the means for storing a charge determines the level bounds.

10. The analog-to-digital converter of claim 9, wherein the means for adjusting the position of the level window comprises means for increasing the position of the level window if the comparison result indicates that the level of the input signal is above the upper bound of the level window, for decreasing the position of the level window if the comparison result indicates that the level of the input signal is below the lower bound of the level window, and for leaving the position of the level window unchanged if the comparison result indicates that the level of the input signal is between the lower bound of the level window and the upper bound of the level window.

11. The analog-to-digital converter of claim 9, wherein the means for outputting digital information comprises means for counting up and down in dependence on the comparison result and in response to a clock signal, and for outputting a count value as the digital information.

12. The analog-to-digital converter of claim 11, wherein the count value remains constant when the comparison result indicates that the level of the analog input signal lies between the lower bound and the upper bound.

13. The analog-to-digital converter of claim 9, wherein the digital information changes in coordination with the position of the level window.

14. The analog-to-digital converter of claim 9, wherein the analog-to-digital converter comprises means for providing information to adjust the position of the level window in response to a clock signal determining sampling times when the comparison result is processed to update a level window position control signal fed to the means for adjusting a position of the level window.

15. The analog-to-digital converter of claim 9, wherein the means for storing a charge and the means for providing a current are part of a means for performing an analog integration of a signal being dependent on the comparison result, to obtain, as a result of the integration, an analog signal for adjusting the position of the level window.

16. The analog-to-digital converter of claim 9, wherein the analog-to-digital converter further comprises means for low-pass-filtering an external input signal, to obtain the analog input signal as a low-pass-filtered version of the external input signal.

17. The analog-to-digital converter of claim 9, wherein the analog-to-digital converter comprises means for recovering a clock signal being based on a data rate of data symbols comprised in the analog input signal, wherein a frequency of the recovered clock signal is at least by a factor of 2 higher than the data rate, wherein the means for adjusting the position of the level window comprises means for adjusting the position of the level window in response to the recovered clock signal, and wherein the means for outputting the digital information comprises means for updating the digital information in response to the recovered clock signal.

18. A method for converting an analog input signal into digital information, the method comprising:

comparing the analog input signal with an upper bound and a lower bound of a level window to produce a comparison result;

adjusting a position of the level window based on the comparison result; and outputting the digital information based on the comparison result, wherein adjusting the position of the level window comprises providing, using a controlled current source, a current for charging a capacitor, for discharging the capacitor or for leaving the charge of the capacitor unchanged, in dependence on the comparison result, performing an analog integration of the current provided by the controlled current source, and wherein the position of the level window is adjusted in dependence on the voltage of the capacitor, and wherein outputting the digital information comprises counting up and down in dependence on the comparison result and outputting a count value as the digital information.

19. An analog-to-digital converter, comprising:

means for comparing an analog input signal with an upper bound and a lower bound of level window to produce a comparison result;

means for adjusting a position of the level window based on information derived from the comparison result and indicating, whether the level window should be increased, decreased or maintained;

means for outputting digital information based on the comparison result; and means for recovering a clock signal being based on a data rate of data symbols comprised in the analog input signal, wherein a frequency of the recovered clock signal is at least by a factor of 2 higher than the data rate, wherein the means for adjusting the position of the level window comprises means for adjusting the position of the level window in response to the recovered clock signal, and wherein the means for outputting the digital information comprises means for updating the digital information in response to the recovered clock signal.

20. An analog-to-digital converter, comprising:

a window-comparator comprising an input for an analog input signal and an output for a comparison result indicating a result of a comparison of the analog input signal with an upper bound and a lower bound of a level window;

a level window position signal generator comprising an output for a level window position signal adjusting a position of the level window based on information derived from the comparison result and indicating whether the level window should be increased, decreased or maintained;

a counter; and an output for digital information based on the comparison result;

wherein the level window position for signal generator comprises an analog integrator configured to perform an analog integration of a signal being dependent on the comparison result to obtain, as a result of the integration, the level window position signal in the form of an analog signal; and wherein the counter comprises a count-up/count-down control input coupled, directly or via a control logic, to the output for the comparison result, and a counter state interface for the digital information.

* * * * *